United States Patent [19]

Kaiser et al.

[11] Patent Number: 4,525,429
[45] Date of Patent: Jun. 25, 1985

[54] POROUS SEMICONDUCTOR DOPANT CARRIERS

[75] Inventors: Gregory A. Kaiser, Lewiston; Gabriel P. DeMunda, Niagara Falls, both of N.Y.; Richard E. Tressler, Julian, Pa.

[73] Assignee: Kennecott Corporation, Cleveland, Ohio

[21] Appl. No.: 502,287

[22] Filed: Jun. 8, 1983

[51] Int. Cl.³ .............................................. H01F 3/02
[52] U.S. Cl. .................... 428/566; 29/576 R; 148/1.5; 148/189; 264/59; 357/63
[58] Field of Search ............ 29/576 R; 148/1.5, 189; 264/59; 357/63; 428/566

[56] References Cited

U.S. PATENT DOCUMENTS

| | | | |
|---|---|---|---|
| 3,640,806 | 2/1972 | Watanabe et al. | 357/48 X |
| 3,951,587 | 4/1976 | Alliegro et al. | 432/253 |
| 4,028,149 | 6/1977 | Deines et al. | 357/61 X |
| 4,277,320 | 7/1981 | Beguwala et al. | 204/177 |
| 4,292,264 | 9/1981 | Cota et al. | 264/81 |
| 4,381,233 | 4/1983 | Adachi et al. | 204/266 X |

FOREIGN PATENT DOCUMENTS 4134 12/1970 Japan ................................ 148/189

*Primary Examiner*—Leland A. Sebastian
*Attorney, Agent, or Firm*—Harold M. Snyder; Gary R. Plotecher; David M. Ronyak

[57] ABSTRACT

New porous semiconductor dopant carriers are disclosed together with a method for the diffusion doping of semiconductors by the vapor phase transport of an n or p type dopant, such as phosphorus, arsenic, antimony, boron, gallium, aluminum, zinc, silicon, tellurium, tin and cadmium to the semiconductor host substrate; wherein the dopant source comprises a dopant containing porous, inert, rigid dimensionally stable and thermal shock resistant carrier comprised of SiC, elemental silicon or mixtures thereof.

4 Claims, No Drawings

POROUS SEMICONDUCTOR DOPANT CARRIERS

FIELD OF INVENTION

This invention relates to novel porous, inert, rigid, dimensionally stable and thermal shock resistant, vapor diffusion dopant carriers comprised of SiC, elemental silicon or mixtures thereof, to methods of providing such carriers, to diffusion sources containing said carriers and to a method for diffusion doping semiconductors utilizing diffusion sources containing said carriers.

BACKGROUND OF THE INVENTION

Semiconductor elements have multiple applications and utility in the electronics industry and are used in rectifiers, transistors, photodiodes, solar batteries, radiation detectors, charged particle detectors, integrated circuits and various other applications. They have been known in the industry for many years and the term semiconductor element is generally accepted throughout the industry and intended in this application to generically include semiconductor devices and parts thereof formed of host substrates comprising elements, alloys and intermetallic compounds of silicon, germanium, silicon/germanium, gallium arsenide, indium phosphide and the like. Such semiconductor elements can be of any convenient or suitable shape or form but are typically commercially used in the form of circular, rectangular or triangular wafers or disks.

In order to achieve the various electrical rectification characteristics so important to their multiple applications and utilities, semiconductor elements typically have an active impurity incorporated within the host substrate, during manufacture or later by diffusion, which impurity affects the electrical rectification characteristics of the semiconductor element. These active impurities are usually classified as donor impurities or acceptor impurities; the donor impurities including phosphorus, arsenic, antimony, silicon, tellurium, tin and the like; and, the acceptor impurities including boron, gallium, aluminum, zinc, cadmium, and the like.

The semiconductor element may have a region thereof containing an excess of donor impurities thus yielding an excess of free electrons. Such region is termed an impurity doped n-type region. Similarly, the semiconductor element may have a region thereof containing an excess of acceptor impurities, which results in a deficit of electrons, such region being termed an impurity doped p-type region. The boundary between such p-type and n-type regions is termed the n-p or p-n junction. In many applications the uniformity of the impurity distribution within the p or n type region, as well as the sharpness of the p-n or n-p junction, is critical to the efficiency of the semiconductor element.

Multiple means have been proposed for incorporating various active impurities in the semiconductor element. Typically, the active impurity may be intimately incorporated during preparation of the host substrate or may be incorporated by deposition on the host substrate during manufacture.

DESCRIPTION OF THE PRIOR ART

The deposition of active impurities at the surface of the semiconductor host substrate during manufacture typically comprises the high temperature diffusion of vaporized dopant atoms into the body of the host substrate. Typically the diffusion of the doping substance into the host substrate is achieved by heating a predetermined quantity of dopant, together with the host substrate, in a closed receptacle in such manner that dopant atoms will permeate the semiconductor body from all or select sides. One method, involving deposition of dopants on a limited surface of a semiconductor element, is described in U.S. Pat. No. 3,287,187 wherein an oxide of the host substrate material is deposited on the host substrate followed by diffusion of the doping substance into the substrate surface area by heating the host substrate.

U.S. Pat. No. 3,923,563 depicts a typical method of deposition and diffusion wherein porous, rigid dimensionally stable wafers are formed by compacting and sintering refractory oxide powders. The thus formed wafers are then impregnated with aluminum metaphosphate, arsenic oxide or antimony oxide by treatment with solutions thereof in suitable organic or aqueous solvents. These wafers function as the source of dopant vapors and are positioned in a suitable furnace in the vicinity of the host substrate. The dopant wafer and host substrate are heated to temperatures between about 850° C. to about 1250° C. wherein the dopant wafer liberates phosphorus, arsenic or antimony oxide vapors which pass through the furnace and contact the host substrate. The vapors appear to react with the hot silicon surface and the elemental phosphorus, arsenic and/or antimony diffuse into the host substrate with continued heating to create the semiconductor element.

U.S. Pat. No. 3,920,882 discloses a solid dopant source comprising a porous, inert, rigid, dimensionally stable, refractory support impregnated with a dopant component. The porous supports are formed by compacting and sintering refractory oxide powders such as stabilized zirconia powder, alumina powders, silica powders, thoria and the like; they are compacted, sintered and thereafter impregnated with a solution of the dopant component.

OBJECTS OF THE INVENTION

One object of the invention is to provide novel solid dopant carriers comprised of at least one of SiC, elemental Si and mixtures thereof.

Another object of the invention is to provide novel solid dopant sources comprising a carrier containing a dopant and at least one of SiC, elemental Si and mixtures thereof.

A further object of the invention is to provide methods for the preparation of dopant sources and dopant carriers containing at least one of SiC, elemental Si and mixtures thereof.

A still further object is to provide a method for the diffusion doping of semiconductor host substances by a dopant source comprising a dopant deposited on a porous, inert, rigid substantially non-oxide containing carrier material.

These and other objects will be apparent from the following description of the invention.

DESCRIPTION OF THE INVENTION

It has been discovered that solid dopant carriers can be provided, which are capable of liberating active impurities contained thereon at elevated temperatures and which are so dimensionally stable as to have substantially no deformation or slump while maintaining thermal shock resistance, such carriers being comprised of compounds selected from the group consisting of SiC, elemental Si and mixtures thereof.

The solid dopant carrier of the invention can be prepared by various means. One preferred means is to compact crushed particulated SiC, elemental Si or mixtures thereof within an appropriate die to form an appropriate "green compact" of the desired configuration. The green compact is then fired for a time and at a temperature sufficient for sintering to yield the porous, dimensionally stable, dopant carrier of the invention.

Initially, particles of the compounds of this invention are selected to yield a final sintered product having an appropriate porosity and pore size which can be varied dependent upon the dopant which is sought to be carried. Generally, it is desirable to obtain a sintered carrier having a volume porosity of at least about 20% and preferably in the range of 40% to 80%. The pore size of the carrier is also critical in that it should not be so small as to significantly restrict the flow of dopant into the carrier. Typically, average pore size in the range of from about 5 microns to about 250 microns has been found appropriate for most dopants. Such pore size can typically be achieved by utilizing particle size from 1 micron to about 150 microns.

Compacting of the particulate compounds of this invention acts to achieve two purposes, firstly to form the "green compact" necessary for sintering and secondly to achieve a convenient and suitable size and shape of the carrier.

In many instances, it is desirable to hold the crushed particulate together by a binding means to expedite compacting and to further assure appropriate porosity during sintering. Typical binders which have been found useful for molding the particulate compounds of the invention into suitable form include organic binders such as starches, dextrines, gums, flours, casein, gelatins, albumins, proteins, lignins, cellulosics, bitumens, rubbers, alginates, waxes and the like; synthetic resins such as vinyls, acrylics, wax emulsions, paraffin, cellulosics, glycols, epoxies, phenolics and the like; and inorganic binders such as silicates, colloidal silica, colloidal alumina, colloidal aluminates, colloidal silicates and the like.

In certain instances, various additive compounds may be included with the particulate compounds of the invention for purposes such as accelerating sintering or improving the mechanical or thermal strength of the moldings. In such instance, it is important that the amount and type of such additive compounds be controlled so that they do not adversely effect the dopant vaporization or contribute non-desirable diffusable impurities which adversely effect or otherwise undesirably influence the electrical properties of the semiconductor elements.

The additive compounds can be granular or fibrous in shape. Though not generally necessary, fibrous additives have been found effective in enhancing the thermal shock resistance of molded wafers. Granular decomposable additives have been found effective in increasing the porosity of the sintered wafers.

In a preferred embodiment, SiC dopant wafer structural integrity can be achieved by the addition of bonding agents for the sintering process. Typical bonding agents include silicon oxides, silicon nitrides, silicic acid and the like. Mixtures of SiC and elemental silicon are particularly effective in that the elemental silicon also acts on the SiC as a sintering bonding agent. Though applicants do not wish to be limited thereby, it appears that the bonding agents effect the structural integrity during the sintering process which results in an interconnected porosity increasing the available surface area at which diffusion from the dopant wafer takes place, and accordingly can result in both increased life and efficiency of the wafer. It should be understood that in no instance does this invention include an amount of non-dopant additive which comprises more than 10% by weight of the sintered carrier.

In the formation of the solid dopant carriers of the invention, the crushed, particulate compound of the invention is mixed with a binder as before described, with or without an appropriate additive, or bonding agent, then compacted into a suitable die. Compacting the compound/binder mixture is necessary in that it compresses the particulate mixture to an appropriate green density for sintering. Typically, compressing the mixture in the die to a range of between about 1,000 psi to about 10,000 psi is sufficient to obtain an appropriate green density. The thus compacted and formed mixture can then be sintered by heating to between about 700 and 2500° C.

The solid carrier can be formed in any convenient size and shape, but usually it is formed in substantially the same size and shape as the semiconductor element it will be doping. One advantage of the compounds of the instant invention is that they may be molded, compacted and sintered into rods, etc., which thereafter can be cut into wafers, disks, etc., rather than pressing each wafer, disk, etc., individually. It has been found that wafers produced using the compounds of this invention retain their form when subjected to heat treatment with the semiconductor element at a temperature from about 500° C. to about 1400° C. and exhibit thermal shock resistance.

After formation of the solid dopant carrier, it must be impregnated with one or more appropriate dopants and/or other additives for utilization therewith. Any suitable means of impregnation can be utilized with the carrier of this invention including applying molten dopant, powdered dopant, dopant solutions, suspensions, sputtering, molecular beams, vapors, and the like.

A preferred means involves the heating of the carrier with a solution or suspension of the dopant material in organic or aqueous solvent. Generally, the concentration of the solution or suspension is selected to yield a concentration of dopant on the carrier of at least about 10% by weight. After treatment of the carrier with a dopant, the carrier is typically dried by heating.

Multiple dopants can be utilized with the solid carriers of the invention. Typical dopants include compounds containing the elements phosphorus, arsenic, antimony, boron, gallium, aluminum, zinc, indium and the like.

The thus formed dopant sources are typically ready for use in the vapor deposition process without any further processing steps being required. Typically, wafers of the dopant source are arranged in trays together with wafers of the semiconductor host substrate to be doped and heated to temperatures from about 500° C. to about 1400° C. until appropriate quantities of the active dopant impurities have been deposited on the semiconductor host substance surface.

The following examples are provided to illustrate the invention and are not meant as a limitation thereof. All temperatures are in degrees centigrade unless otherwise indicated.

EXAMPLE 1

30 grams of silicon carbide, screened through a 325 mesh screen, blended with 1.5 grams of Carbowax 200 a polyethylene glycol marketed by Union Carbide Corp., in a mortar and pestle for 10 minutes, dried for one hour at 100° C., and thereafter ballmilled for 5 minutes in a rotary mill at room temperature. The resulting particulate composition is formed into average 3 inch diameter wafers, 60 mil thick, by pressing into an appropriate die at 1000 psi. The thus-formed wafers are fired by heating, in air, to a temperature of 1400° C. in a 4 inch mullite tube furnace for two hours. The wafers are tested and found to have a porosity of more than 20%.

EXAMPLE 2

70 parts of silicon carbide, screened through a 240 mesh screen, 15 parts of silicon carbide screened through a 325 mesh screen, 15 parts of metallic silicon, screened through a 200 mesh screen, 15 parts dextrine and 10 parts de-ionized water are blended in a Hobart mixer for 30 minutes at room temperature. The resulting particulate composition is formed into 55 mil thick, 3.0 inch diameter wafers by pressing into an appropriate die at 3,500 psi. The thus-formed wafers are placed on an alumina plate and nitrided by heating to a temperature of 1450° C. in a four inch mullite tube furnace for 6 hours. On analysis the wafer is found to contain less than 20% $Si_3N_4$ and more than 75% silicon carbide.

EXAMPLE 3

70 parts of metallic silicon, screened through a 70 mesh screen, 30 parts silicon carbide, screened through a 200 mesh screen, 5 parts Dextrine, 5 parts Cere-Amic (gelatinized corn flour) and 10 parts of deionized water, were blended in a Hobart mixer for 30 minutes at room temperature. The resulting particulate composition was formed into average 3.0 inch diameter, 55 mil thick wafers by pressing into an appropriate die at 750 psi. The thus-formed wafers were dried at 60° C. for 24 hours and then heated to 1400° C., held at that temperature for 1 hour, and thereafter heated to 1500° C. and held for 3 hours at that temperature, in a nitrogen atmosphere. The final wafer was found to have a porosity greater than 30%.

EXAMPLE 4

30 grams of silicon powder, screened through a 600 mesh screen, 70 grams of silicon carbide powder, screened through a 200 mesh screen, and 20 grams of phenolic resin are hand mixed in a beaker for 5 minutes at room temperature. The resulting particulate composition is formed into average three inch diameter 60 mil thick wafers, by pressing into an appropriate die at 50 psi. The wafers are cured in air at 200° C. for 2 hours. The thus-formed wafers are fired in a 4 inch mullite tube furnace at 1350° C. in the presence of a gaseous argon atmosphere for 5 hours. Wafer porosity is determined to be greater than 25%.

EXAMPLE 5

60.0 parts of submicron silicon carbide, 0.3 parts aluminum sintering aid, 40.0 parts water, 0.6 parts polyvinyl alcohol, and 0.2 parts polyethylene glycol are ballmilled and mixed for 6 hours at room temperature and thereafter pan dried. The dried powdery mixture is pressed into 3 inch diameter wafers of 50 mil thickness by pressing into an appropriate die at 200 psi. The wafers are fired by heating in a 4 inch graphite tube furnace to 1800° C. for 30 minutes in the presence of a 100% gaseous argon atmosphere. The resultant wafers are determined to have a porosity of more than 25%.

EXAMPLE 6

30 grams of silicon powder, screened through a 600 mesh screen, 70 grams of silicon carbide powder, screened through a 200 mesh screen, 30 grams of carbon black and 20 grams of water are hand blended in a beaker for 10 minutes at room temperature. The resulting particulate composition is formed into 3 inch diameter, 55 mil thickness, wafers by pressing into an appropriate die at 50 psi. The thus formed wafers are fired by heating to a temperature of 1350° C. in a 4 inch mullite tube furnace for 5 hours in the presence of a gaseous argon atmosphere. Wafer porosity is determined to be more than 30%.

EXAMPLE 7

Silicon carbide wafers, produced by the method of Example 3 are sprayed, at room temperature, with an aqueous dopant suspension comprising 100 parts silicon pyrophosphate ($SiP_2O_7$), 122 parts deionized water, 1.5 parts ammonium alginate, 1.0 parts of styrene maleic anhydride copolymer and 0.7 parts of ammonium carboxylate. The amount of dopant sprayed on is an amount sufficient to effect a 50% weight add-on, calculated after drying for one hour at 100° C. The dried dopant containing wafers are thereafter fired at 950° C. for 30 minutes, in air, to sinter the dopant containing wafer source.

The aforesaid prepared dopant source wafers are heated in a diffusion furnace with single crystal silicon host substrate semiconductor elements for 60 minutes at varying temperatures in a 100% nitrogen atmosphere. The resultant phosphorus doped semiconductor elements are etched with a 10% aqueous hydrofluoric acid solution and tested in accord with ASTM F43-78 to determine sheet resistivity. ASTM F43-78 defines a four point probe technique for ascertaining the ratio of potential gradient parallel to the current in the material to the current density. The elements are confirmed to have uniform n-type regions and found to have average sheet resistivity as shown in Table I. The used phosphorus containing dopant wafers do not show deformation such as bending or swelling and retain their porous surface.

EXAMPLE 8

Silicon carbide wafers produced by the method of Example 5 are sprayed, at room temperature, with an aqueous dopant suspension comprising 100 parts, 3 $MgO.As_2O_5$, 122 parts deionized water, 1.5 parts ammonium alginate, 1.0 parts of styrene maleic anhydride copolymer and 0.7 parts ammonium carboxylate to a dry weight add-on of 50% calculated after drying for 1 hour at 100° C. The dried dopant containing wafers are thereafter fired at 1100° C. in air for 1 hour.

Single crystal silicon host substrate semiconductor elements, which have been heated at varying temperatures for varying times with the dopant wafers, etched with 10% hydrofluoric acid and tested in accord with ASTM F 43-78 are found to have average sheet resistivity as shown in Table II.

TABLE I

| Wafer | Diffusion Temp. (°C.) | Diffusion Time (min) | Average Sheet Resistance (Ohms/square) |
| --- | --- | --- | --- |
| A | 1000 | 60 | 4.02 |
| B | 950 | 60 | 7.24 |
| C | 900 | 60 | 17.19 |

TABLE II

| Wafer | Diffusion Temp (°C.) | Diffusion Time (min) | Average Sheet Resistance (Ohms/square) |
| --- | --- | --- | --- |
| D | 1200 | 30 | 40 |
| E | 1100 | 100 | 310 |

We claim:

1. A dopant source for the vapor phase transport of dopant at elevated temperatures in the form of a sintered carrier member having a wafer configuration comprising at least 90 percent of silicon carbide, said sintered member being a solid, porous structure having a porosity of at least about 20 percent with an average pore size in the range from about 5 microns to about 250 microns, the pores thereof being impregnated with a dopant containing an element selected from the group consisting of phosphorus, arsenic, antimony, boron, gallium, aluminum, zinc, silicon, tellurium, tin and cadmium.

2. The dopant source of claim 1 wherein said sintered carrier member also comprises elemental silicon.

3. The dopant source of claim 1 wherein said dopant is selected from phosphorus, arsenic and boron.

4. The dopant source of claim 1 wherein said dopant is $MgO \cdot As_2O_5$.

* * * * *